(12) United States Patent
Shima

(10) Patent No.: US 11,553,603 B2
(45) Date of Patent: Jan. 10, 2023

(54) METHOD OF MANUFACTURING CIRCUIT BOARD AND CIRCUIT BOARD

(71) Applicant: TOKIN CORPORATION, Sendai (JP)

(72) Inventor: Hiroshi Shima, Tokyo (JP)

(73) Assignee: TOKIN CORPORATION, Sendai (JP)

( * ) Notice: Subject to any disclaimer, the term of this patent is extended or adjusted under 35 U.S.C. 154(b) by 0 days.

(21) Appl. No.: 17/207,456

(22) Filed: Mar. 19, 2021

(65) Prior Publication Data
US 2022/0022327 A1 Jan. 20, 2022

(30) Foreign Application Priority Data
Jul. 20, 2020 (JP) ............................... JP2020-123922

(51) Int. Cl.
H05K 1/18 (2006.01)
H05K 3/46 (2006.01)
H05K 1/02 (2006.01)

(52) U.S. Cl.
CPC ......... H05K 3/4697 (2013.01); H05K 1/0298 (2013.01); H05K 2201/083 (2013.01)

(58) Field of Classification Search
CPC ............... H05K 3/4697; H05K 1/0298; H05K 2201/083
USPC ........................................................ 361/761
See application file for complete search history.

(56) References Cited

U.S. PATENT DOCUMENTS

| 2010/0007215 A1* | 1/2010 | Sakuma | ................. H01F 27/366 335/297 |
| 2015/0235753 A1* | 8/2015 | Chatani | ............... H01F 41/0233 336/200 |
| 2017/0034629 A1* | 2/2017 | Mao | ........................ H04R 9/025 |
| 2017/0034631 A1* | 2/2017 | Wang | ..................... H04R 9/045 |

FOREIGN PATENT DOCUMENTS

| JP | 6062691 B2 | 12/2016 |
| JP | 2017162902 A * | 9/2017 |
| JP | 6383215 B2 | 8/2018 |
| JP | 2020004966 A | 1/2020 |
| JP | 6668113 B2 | 2/2020 |

* cited by examiner

*Primary Examiner* — Andargie M Aychillhum
(74) *Attorney, Agent, or Firm* — Holtz, Holtz & Volek PC

(57) ABSTRACT

A method includes preparing a first substrate member in which a cavity is formed. Moreover, the method includes preparing a magnetic member having a plurality of magnetic pieces. The magnetic member is placed in the cavity, and the second substrate member is placed on the first substrate member to close the cavity. The cavity is defined at least in part by a pair of wall surfaces facing each other in a lateral direction and opens upward in an up-down direction perpendicular to the lateral direction. The magnetic pieces are coupled with each other by positioning members so as to be arranged at regular intervals in a predetermined direction. The placing of the magnetic member in the cavity is carried out so that the predetermined direction coincides with the lateral direction or a front-rear direction perpendicular to both of the lateral direction and the up-down direction.

9 Claims, 10 Drawing Sheets

METHOD OF MANUFACTURING CIRCUIT BOARD AND CIRCUIT BOARD

CROSS REFERENCE TO RELATED APPLICATIONS

This application is based on and claims priority under 35 U.S.C. § 119 to Japanese Patent Application No. JP2020-123922 filed Jul. 20, 2020, the contents of which are incorporated herein in their entirety by reference.

BACKGROUND OF THE INVENTION

This invention relates to a method of manufacturing a circuit board and to the circuit board. Particularly, the present invention relates to a method of manufacturing a circuit board which a magnetic member is built in and to the circuit board which the magnetic member is built in.

JP 2020-004966A (Patent Document 1) discloses an example of a circuit board which a magnetic member is built in. The circuit board of Patent Document 1 is provided with a primary substrate with a cavity formed therein, a magnetic member placed in the cavity, an upper prepreg and a lower prepreg. The upper prepreg and the lower prepreg are arranged on an upper surface of the primary substrate and a lower surface of the primary substrate, respectively.

The magnetic member built in the circuit board is used as a magnetic core. In order to obtain desired characteristics as the magnetic core, the magnetic member is generally provided with a gap. Here, a single large gap causes a wide leakage range of magnetic fluxes and gives a large influence on surroundings. Accordingly, in the magnetic member built in the circuit board, it is desirable to employ dispersed gaps which can reduce a leakage range of magnetic fluxes.

In the circuit board of Patent Document 1, the cavity corresponds to the magnetic member in a one-to-one relationship. In order to form a magnetic core provided with dispersed gaps by the use of this structure, a plurality of cavities and a plurality of magnetic pieces corresponding to the cavities, respectively, are necessary. Here, there is a space between each of the cavities and the magnetic piece corresponding thereto in general. Accordingly, positions of the magnetic pieces each of which is place in the cavity corresponding thereto may have variations, and a gap between adjacent two of the magnetic pieces may have variation. As a result, the magnetic core formed by the use of the structure of Patent Document 1 and provided with the dispersed gaps has a problem that desired characteristics may not be obtained.

SUMMARY OF THE INVENTION

It is therefore an object of the present invention to provide a method of manufacturing a circuit board, wherein the method can arrange a plurality of magnetic pieces at regular intervals in a cavity formed in a substrate. Moreover, it is another object of the present invention to provide a circuit board having a plurality of magnetic pieces placed in a cavity thereof and arranged at regular intervals.

One aspect of the present invention provides a method of manufacturing a circuit board. The method comprising: preparing a first substrate member in which a cavity is formed, the cavity being defined at least in part by a pair of wall surfaces facing each other in a lateral direction and opens upward in an up-down direction perpendicular to the lateral direction; preparing a magnetic member having a plurality of magnetic pieces which are coupled with each other by at least one positioning member so as to be arranged at regular intervals in a predetermined direction; placing the magnetic member in the cavity so that the predetermined direction coincides with the lateral direction or a front-rear direction perpendicular to both of the lateral direction and the up-down direction; and closing the cavity by placing a second substrate member on the first substrate member.

Another aspect of the present invention provides a circuit board which comprises a first substrate member, a magnetic member and a second substrate member. The first substrate member is formed with a cavity corresponding to the magnetic member. The cavity is defined at least in part by a pair of wall surfaces facing each other in a lateral direction and opens upward in an up-down direction perpendicular to the lateral direction. The magnetic member has a plurality of magnetic pieces. The magnetic pieces are placed in the cavity and arranged at regular intervals along the lateral direction or a front-rear direction perpendicular to both of the lateral direction and the up-down direction. The second substrate member is placed on the first substrate member to close the cavity.

The method of manufacturing the circuit board according to the present invention uses the plurality of the magnetic pieces which are coupled with each other by the at least one positioning member so as to be arranged at regular intervals in the predetermined direction. With this structure, even when a position of the magnetic member varies, an interval between adjacent two of the magnetic pieces does not vary. Thus, the method according to the present invention can manufacture the circuit board having the magnetic pieces which are placed in the cavity formed in the substrate and which is arranged at the regular intervals.

An appreciation of the objectives of the present invention and a more complete understanding of its structure may be had by studying the following description of the preferred embodiment and by referring to the accompanying drawings.

Figure 1:
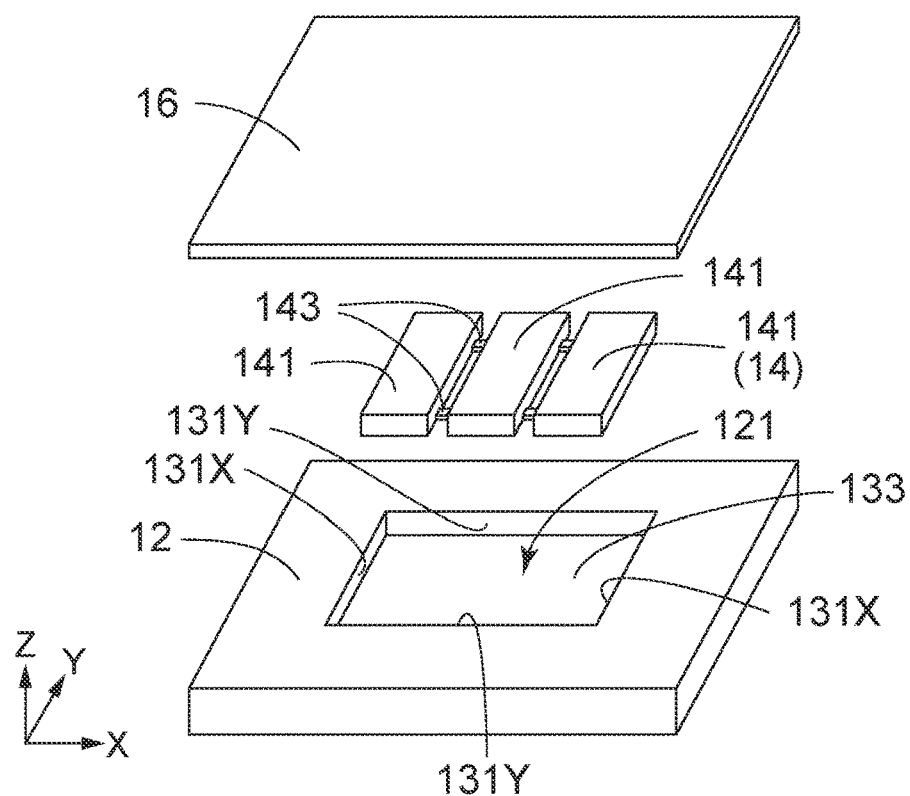
FIG. 1 is an exploded, perspective view showing a circuit board before forming a conductor portion according to an embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

Referring to FIG. 1, a circuit board 10 according to an embodiment of the present invention is provided with a first substrate member 12, a magnetic member 14 and a second substrate member 16. The circuit board 10 is a circuit board 10 in which a conductor portion 22 mentioned later is not formed or a circuit board 10 before forming a conductor portion.

As shown in FIG. 1, the first substrate member 12 has a rectangular board shape. A cavity 121 having a rectangular shape is formed in a middle portion of the first substrate member 12. The first substrate member 12 may be made of a single rectangular board member or may be made by stacking a plurality of board members. Alternatively, the first substrate member 12 may be made by combining a board member(s) and a seat member(s).

The cavity 121 of the first substrate member 12 may be formed by processing a rectangular board member. Alternatively, the cavity 121 may be formed by sticking a frame board member and a rectangular board or sheet member on each other. A glassy epoxy may be used as the board member, for example. Moreover, a prepreg may be used as the sheet member, for example.

As understood from FIG. 1, the cavity 121 of the first substrate member 12 corresponds to the magnetic member 14. In other words, the cavity 121 has volume which can accommodate the magnetic member 14. In the present embodiment, the cavity 121 is defined by four sidewalls 131X, 131X, 131Y and 131Y and a bottom surface 133. Moreover, the cavity 121 opens upward in an up-down direction. In the present embodiment, the four sidewalls 131X, 131X, 131Y and 131Y consist of a pair of the sidewalls 131X and 131X which face each other in a lateral direction perpendicular to the up-down direction and a pair of the sidewalls 131Y and 131Y which face each other in a front-rear direction perpendicular to both of the up-down direction and the lateral direction. In the present embodiment, the up-down direction is a Z-direction. A positive Z-direction is directed upward while a negative Z-direction is directed downward. Moreover, the lateral direction is an X-direction, and the front-rear direction is a Y-direction.

Figure 2:
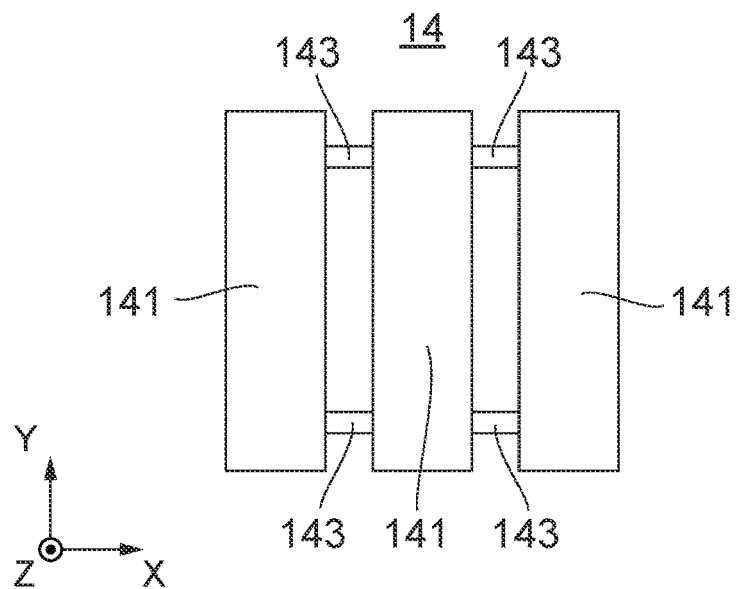
FIG. 2 is a plan view showing a magnetic member included in the circuit board of FIG. 1.
Figure 3:
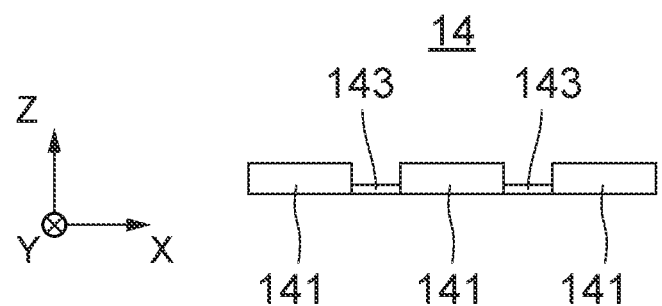
FIG. 3 is a front view showing the magnetic member of FIG. 2.

As shown in FIGS. 2 and 3, the magnetic member 14 has a plurality of magnetic pieces 141. In the present embodiment, the number of the magnetic pieces 141 is three. However, the present invention is not limited thereto. The number of the magnetic pieces 141 may be two or four or more.

As shown in FIGS. 2 and 3, each of the magnetic pieces 141 has a rectangular board shape. In the present embodiment, the magnetic pieces 141 are formed so as to have the same shape and the same size as each other. Moreover, the magnetic pieces 141 are arranged at predetermined intervals in a predetermined direction so that long edges of the magnetic pieces 141 are parallel to one another. In order to realize the arrangement, the magnetic pieces 141 are coupled with each other by positioning members 143. A space between adjacent two of the magnetic pieces 141 works as a gap in a magnetic circuit. Accordingly, the predetermined intervals should be decided according to magnetic characteristics required for the magnetic member 14. The predetermined direction is a direction which is decided freely. In the present embodiment, the predetermined direction coincides with the lateral direction.

As shown in FIGS. 2 and 3, in the present embodiment, adjacent two of the magnetic pieces 141 are coupled with each other by two of the positioning members 143. Each of the positioning members 143 couples one surfaces of adjacent two of the magnetic pieces 141 with each other. In detail, each of the positioning members 143 couples surfaces, which face each other, of adjacent two of the magnetic pieces 141 with each other. However, the present invention is not limited thereto. The magnetic pieces 141 adjacent to each other should be coupled with each other by at least one positioning member 141.

In the present embodiment, the positioning members 143 are made of material identical to that of the magnetic pieces 141 and integrally formed with the magnetic pieces 141. As the material of the magnetic pieces 141 and the positioning members 143, soft magnetic metal powder bound by binder can be used. However, the present invention is not limited thereto. The positioning members 143 may be made of material different from that of the magnetic pieces 141. Moreover, the number and an arrangement of the positioning members 143 may be decided according to material to be used and the like.

Figure 4:
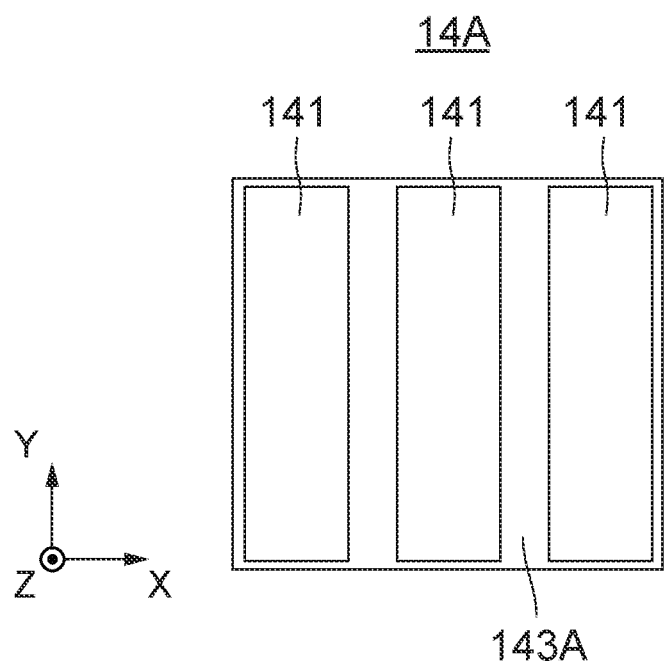
FIG. 4 is a plan view showing a modified example of the magnetic member of FIG. 2.
Figure 5:
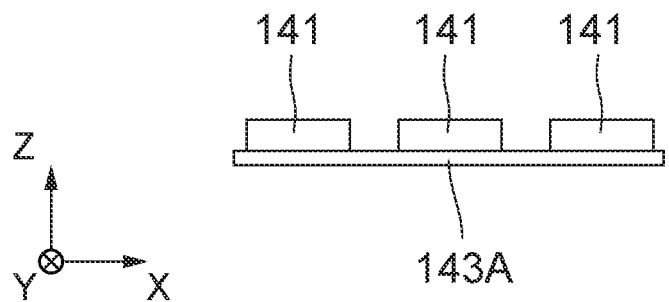
FIG. 5 is a front view showing the magnetic member of FIG. 4.

FIGS. 4 and 5 show another magnetic member 14A which can be used in the circuit board 10 instead of the magnetic member 14. The magnetic member 14A is provided with a plurality of magnetic pieces 141 and a positioning member 143 which is made of a single insulating resin sheet. The positioning member 143A couples one surfaces of the magnetic pieces 141 with one another. In detail, the positioning member 143A couple lower surfaces of the magnetic pieces 141 with one another. In each of the lateral direction and the front-rear direction, a size of the positioning member 143A is larger than that of an area on which the magnetic pieces 141 are arranged. However, the present invention is not limited thereto. In at least one of the lateral direction and the front-rear direction, the size of the positioning member 143A may be equal to or smaller than that of the area on which the magnetic pieces 141 are arranged. But the positioning member 143A should couple the magnetic pieces 141 with one another.

Figure 6:
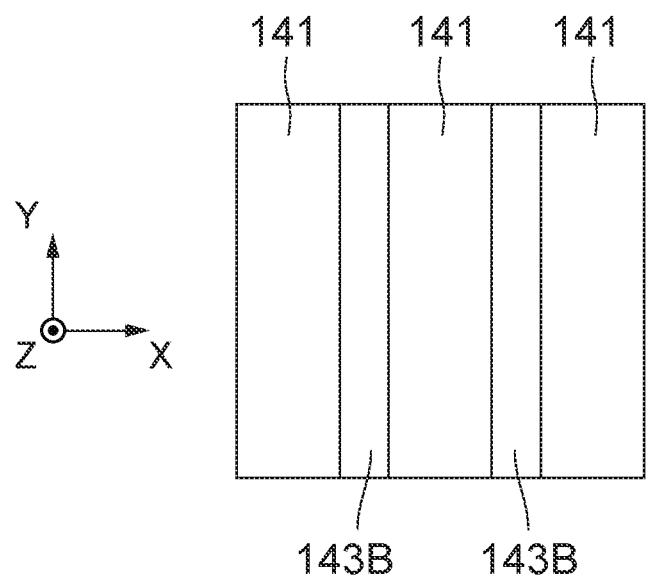
FIG. 6 is a plan view showing another modified example of the magnetic member of FIG. 2.
Figure 7:
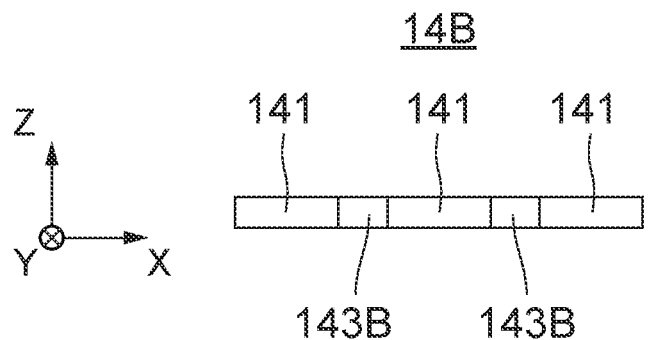
FIG. 7 is a front view showing the magnet member of FIG. 6.

FIGS. 6 and 7 show yet another magnetic member 14B which can be used in the circuit board 10 instead of the magnetic member 14. The magnetic member 14B is provided with a plurality of magnetic pieces 141 and a plurality of positioning members 143B which is made of insulating resin. Each of the positioning members 143B couples one surfaces of adjacent two of the magnetic pieces 141 with each other. In detail, the positioning member 143B couples surfaces, which face each other, of adjacent two of the magnetic pieces 141 with each other. In the front-rear direction, a size of the positioning member 143B is equal to that of the magnetic piece 141. However, the present invention is not limited thereto. In the front-rear direction, the size of the positioning member 143B may be smaller than that of the area on which the magnetic pieces 141 are arranged.

Referring to FIG. 1 again, the second substrate member 16 has a rectangular board or sheet shape. In each of the lateral direction and the front-rear direction, a size of the second substrate member 16 is larger than that of the cavity 121. In the present embodiment, the size of the second substrate member 16 is equal to a size of the first substrate member 12 in each of the lateral direction and the front-rear direction. However, the present invention is not limited thereto. The second substrate member 16 should have an extent enough to close the cavity 121 or an opening of the cavity 121. The second substrate member 16 is a prepreg, for example.

Figure 8:
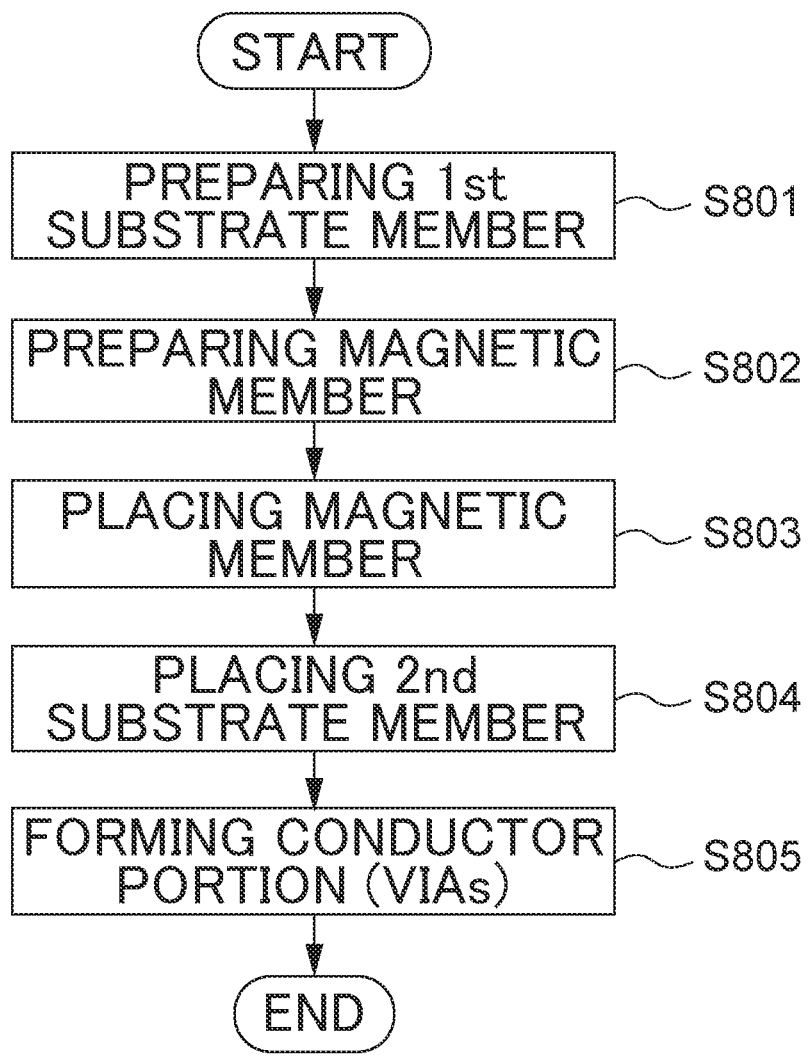
FIG. 8 is a flowchart for describing a method of manufacturing the circuit board of FIG. 1.

Referring to FIG. 8 in addition to FIG. 1, the description will be made about a method of manufacturing the circuit board 10 according to the present embodiment.

First, the first substrate member 12 in which the cavity 121 is formed is prepared (Step S801). The cavity 121 may be formed by processing a board member to be the first substrate member 12 or by bonding a frame-shape board member and another board member or a sheet member to each other.

Next, the magnetic member 14 having the plurality of the magnetic pieces 141 is prepared (Step S802). The magnetic pieces 141 may be integrally formed with the positioning members 143. Alternatively, the magnetic pieces 141 may be coupled with one another by the positioning member 143A or the positioning members 143B, wherein each of the positioning member 143A and the positioning members 143B is made of material different from that of the magnetic pieces 141. At any rate, the magnetic pieces 141 are coupled with one another, and a space between adjacent two of the magnetic pieces 141 is maintained at the predetermined interval.

Next, the magnetic member 14 is placed in the cavity 121 of the first substrate member 12 (Step S803). At that time, the magnetic member 14 is placed in the cavity 121 so that the predetermined direction coincides with the lateral direction. However, the invention is not limited thereto. The magnetic member 14 may be placed in the cavity 121 so that the predetermined direction coincides with the front-rear direction according to required characteristics for the circuit board 10. Thus, the magnetic pieces 141 are placed in the cavity 121 at the predetermined intervals along the lateral direction or the front-rear direction.

Next, the second substrate member 16 is placed on the first substrate member 12 so as to close the cavity 121 or the opening the cavity 121 (Step S804). At that time, the second substrate member 16 is fixed to the first substrate member 12 using insulating adhesive or the like. In a case where the second substrate member 16 is a prepreg, a resin included in the prepreg may be used instead of the insulating adhesive. In each case, the cavity 121 should be filled with the insulating adhesive or the resin. If necessary, the cavity 121 is filled with a resin before the second substrate member 16 is placed on the first substrate member 12. In the manner mentioned above, the circuit board 10 shown in FIG. 1 or the circuit board 10 before forming the conductor portion is completed.

Next, the conductor portion 22 (see FIGS. 9 and 10) is formed to the circuit board 10 before forming the conductor portion (Step S805). In this manner, a circuit board 20 after forming the conductor portion is completed, wherein the conductor portion 22 is formed to the circuit board 20.

Figure 9:
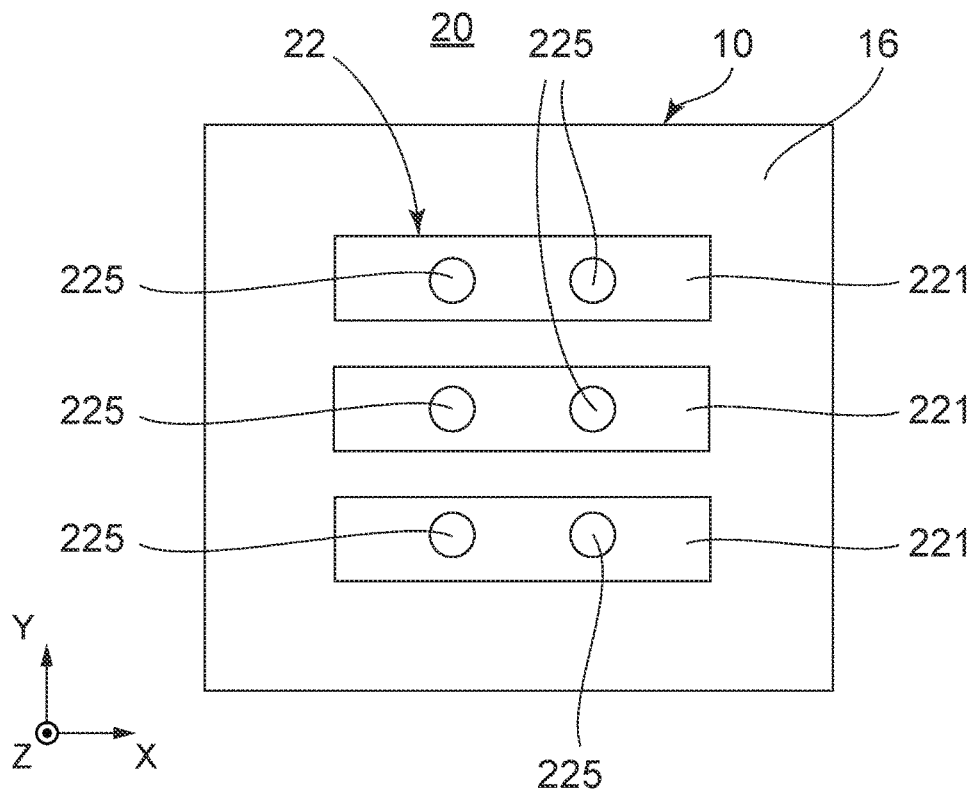
FIG. 9 is a plan view showing a circuit board after forming the conductor portion, wherein the circuit board is manufactured using the circuit board of FIG. 1.
Figure 10:
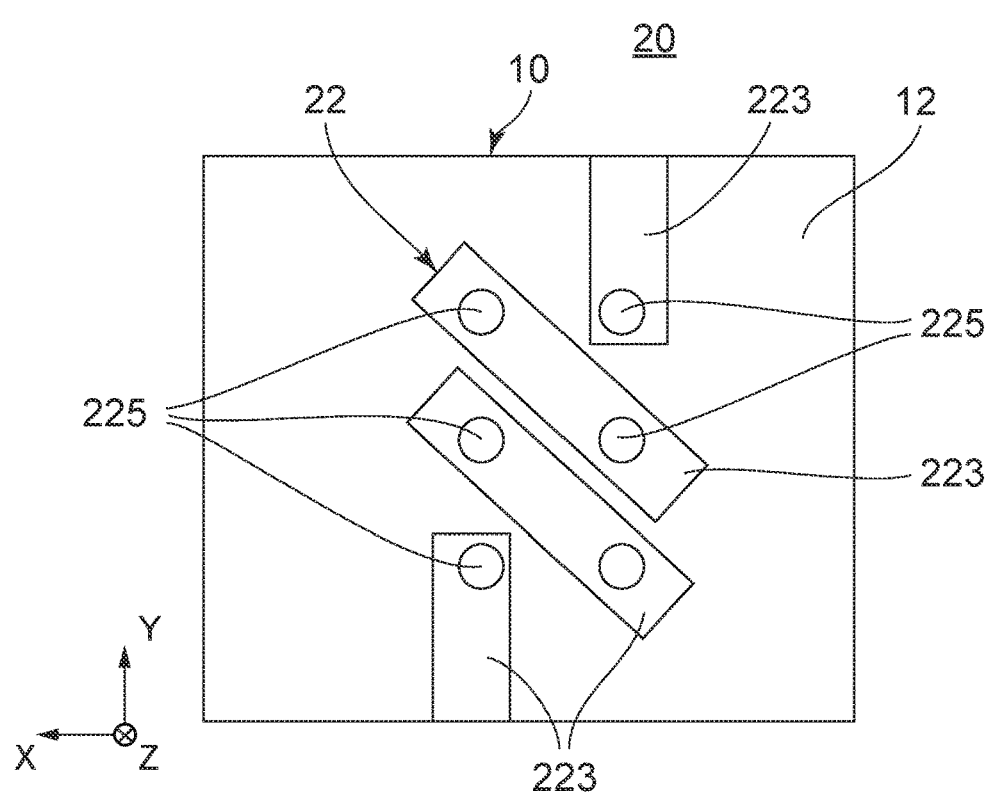
FIG. 10 is a bottom view showing the circuit board after forming the conductor portion of FIG. 9.

As understood from FIGS. 9 and 10, the conductor portion 22 consists of a plurality of upper conductor portions 221, a plurality of lower conductor portions 223 and a plurality of vias 225. The upper conductor portions 221 are formed on an upper surface of the second substrate member 16. The lower conductor portions 223 are formed on a lower surface of the first substrate member 12. In addition, each of the vias 225 is formed so as to pierce the first substrate member 12 and the second substrate member 16 and to electrically couple one of the upper conductor portions 221 and one of the lower conductor portions 223 with each other. In detail, the upper conductor portions 221, the lower conductor portions 223 and the vias 225 are connected to one another so as to form a coil. In the present embodiment, the upper conductor portions 221 are three in number, and the lower conductor portions 223 are four in number. Moreover, in the present embodiment, the vias 225 are six in number. However, the present invention is not limited thereto. The numbers and arrangement of the upper conductor portions 221, the lower conductor portions 223 and the vias 225 may be decided according desired characteristics.

A method of forming the conductor portion 22 is not particularly limited, and the conductor portion 22 may be formed a well-known method. In that case, the vias 225 may be formed after forming the upper conductor portions 221 and the lower conductor portions 223. Alternatively, the upper conductor portions 221 and the lower conductor portions 223 may be formed after forming the vias 225. The forming of the vias 225 may be carried out independently of both of the forming of the upper conductor portions 221 and the forming of the lower conductor portions 223. Alternatively, the forming of the vias 225 may be simultaneously carried out with one of or both of the forming of the upper conductor portions 221 and the forming of the lower conductor portions 223.

Figure 11:
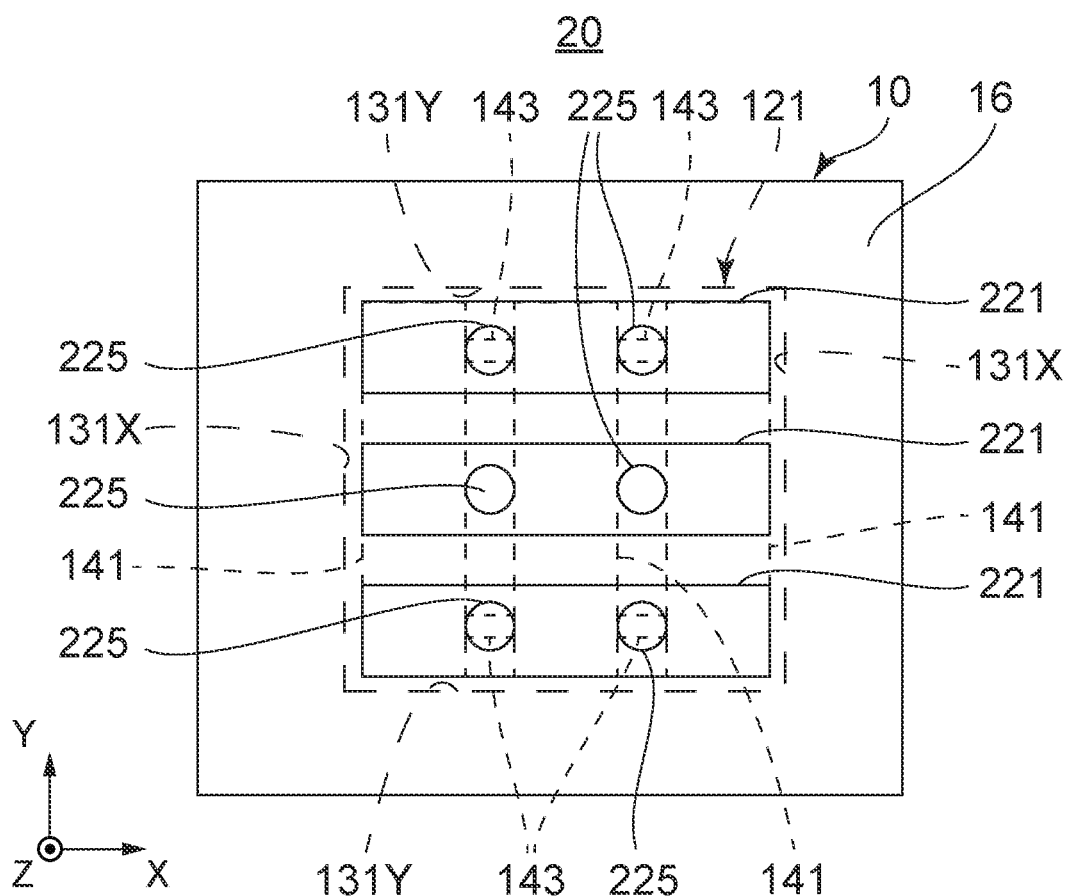
FIG. 11 is a plan view showing a positional relationship between vias and the magnetic member in the circuit board of FIG. 9. A cavity and the magnetic member are illustrated by broken lines.

Referring to FIG. 11, in the circuit board 20 after forming the conductor portion, the vias 225 are formed in an area where they can pass through the cavity 121. In detail, in the area where the vias 225 can pass through the cavity 121, the vias 225 are formed to pierce the first substrate member 12 (see FIG. 10) and the second substrate member 16.

As shown in FIG. 11, four of the vias 225, which are located outward in the front-rear direction, are formed at positions which overlap with the positioning members 143, respectively. Each of these vias 225 removes the positioning member 143 corresponding thereto at least in part, and thereby adjacent two of the magnetic pieces 141 are divided from each another. In other words, the method of manufacturing the circuit board 20 according to the present embodiment is provided with forming the vias 225 which pierce the first substrate member 12 and the second substrate member 16 so as to pass through the cavity 121, and thereby the positioning members 143 are removed at least in part so that the magnetic pieces 141 are divided from one another.

Figure 12:
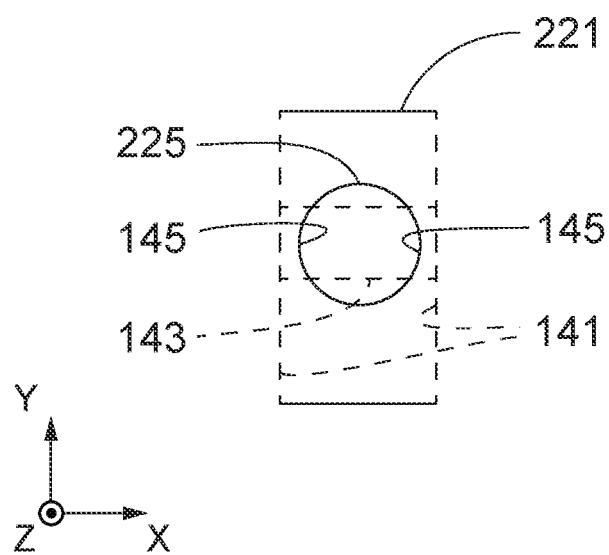
FIG. 12 is a plan view showing an example of a relationship between the via and a positioning member in the circuit board of FIG. 11.

As understood from FIG. 12, a diameter size of the via 225 is equal to or larger than a size of the positioning member 143 in the front-rear direction. In other words, the forming of the via 225 is carried out so that the diameter size of the via 225 is larger than a width size of the positioning member 143 in a width direction (the front-rear direction) perpendicular to the predetermined direction. This is because when the diameter size of the via 225 is smaller than the width size of the positioning member 143 in the front-rear direction, the magnetic pieces 141 adjacent to each other remain coupled with each another. In other words, this is because the magnetic pieces 141 adjacent to each other are not divided from each other by forming of the vias 225 and the desired magnetic characteristics for the circuit board 20 are not obtained.

Figure 13:
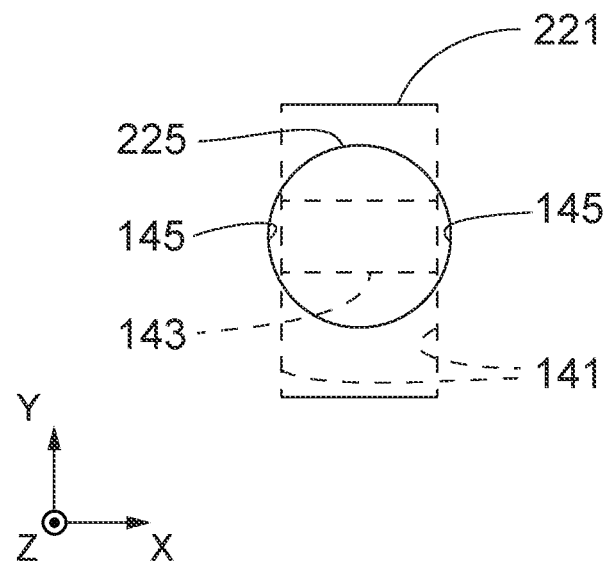
FIG. 13 is a plan view showing another example of the relationship between the via and the positioning member in the circuit board of FIG. 11.

On the other hand, as understood form FIG. 13, in the lateral direction, it is preferable that the diameter size of the via 225 is smaller than an interval size (the predetermined interval) between the magnetic pieces 141 adjacent to each other. This is because of the following reason. If the diameter size of the via 225 is larger than the predetermined interval in the lateral direction, only one of the magnetic pieces 141 adjacent to each other may be remarkably removed in part when a formation position of the via 225 is displaced by a manufacturing accidental error. As a result, the desired magnetic characteristics for the circuit board 20 may not be obtained.

As understood from FIG. 12, when the positioning member 143 is cut by forming the via 225, remaining portions of the positioning members 143 remain connected to adjacent surfaces of the magnetic pieces 141 adjacent to each other, each of the remaining portions has a cut mark 145. When the position of the via 225 is displaced by a cause such as manufacturing variation, there is a case where the cut marks 145 remain on the adjacent surfaces of the magnetic pieces 141 adjacent to each other. At any rate, the via 225 is in surface contact with the cut marks 145.

Figure 14:
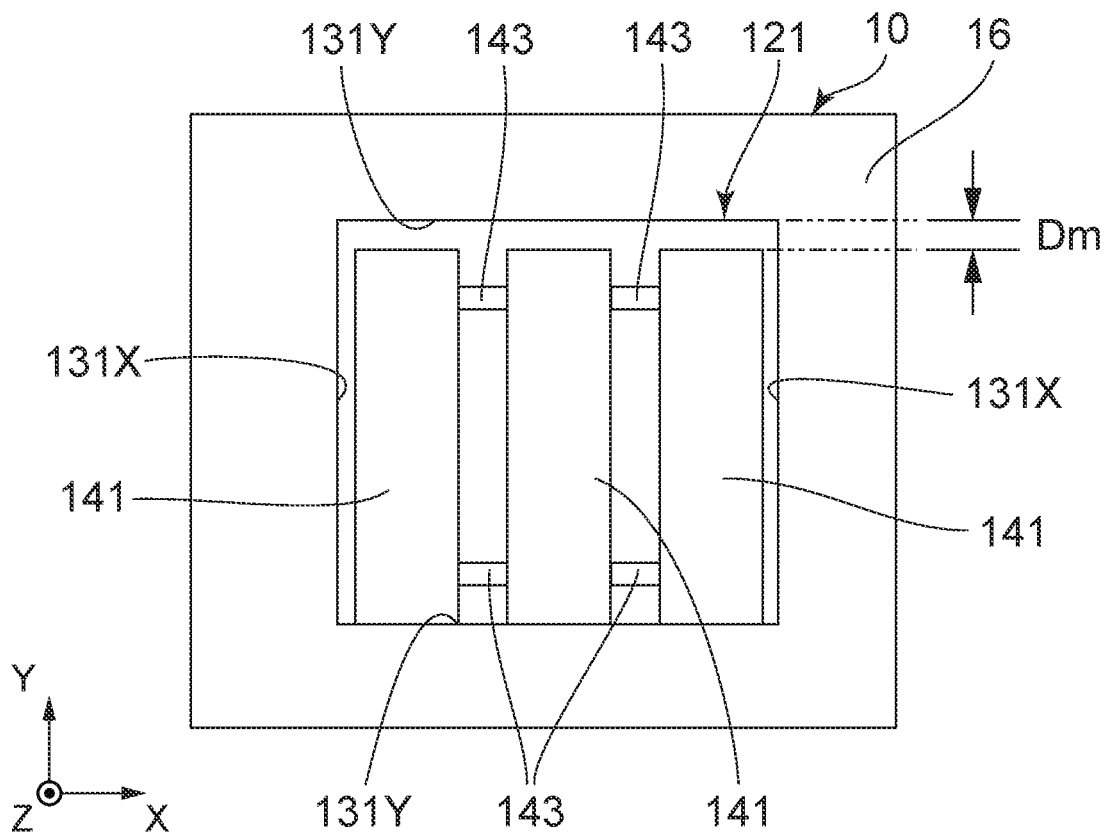
FIG. 14 is a plan view for describing a deference between a size of the cavity and a size of the magnetic member in the circuit board of FIG. 1.
Figure 15:
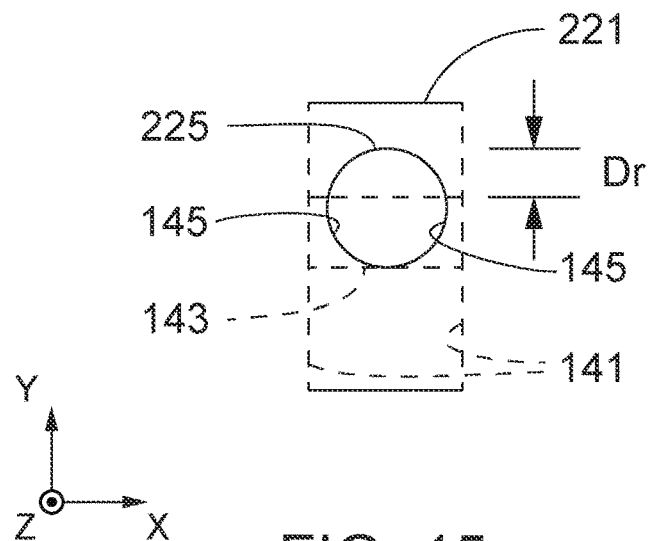
FIG. 15 is a plan view for describing a deference between a diameter size of the via and a width size of the positioning member in the circuit board of FIG. 11.

In each of FIGS. 11 to 13, a center position of the via 225 and a middle position of the positioning member 143 corresponding to the via 225 coincide with each other. However, in an actual manufacturing process, these positions may be varied by a cause such as the manufacturing variation. For example, as shown in FIG. 14, when a difference (a second difference) between the size of the cavity 121 and the size of the magnetic member 14 in the front-rear direction is equal to Dm, the magnetic member 14 is movable with respect to the first substrate member 12 within a range of Dm. Accordingly, in order to cut the positioning member 143 certainly by forming the via 225, the diameter size of the via 225 must be somewhat larger than the size of the positioning member 143. For example, as shown in FIG. 15, when it is assumed that a difference (a first difference) between a width size of the positioning member 143 (a size of the cut mark 145) and the diameter size of the via 225 in the front-rear direction is equal to Dr and that a relative position between the first substrate member 12 and the via 225 is fixed, Dr must be larger than Dm (Dr>Dm). In the present embodiment, the front-rear direction coincides with a perpendicular direction perpendicular to a direction in which the magnetic pieces 141 are arranged (the lateral direction).

At any rate, the position and the size of the positioning member 143 and the position and the size of the via 225 should be designed in consideration of the manufacturing variation so as to cut the positioning member 143 by forming the via 225 and to obtain the desired magnetic characteristics.

As describe above, in the present embodiment, the magnetic pieces 141 are accommodated in the cavity 121 in a state that they are coupled with one another by the positioning members 143. Accordingly, the magnetic pieces 141 can be arranged at the predetermined intervals in the cavity 121, and the circuit board 20 can have the desired magnetic characteristics.

Figure 16:
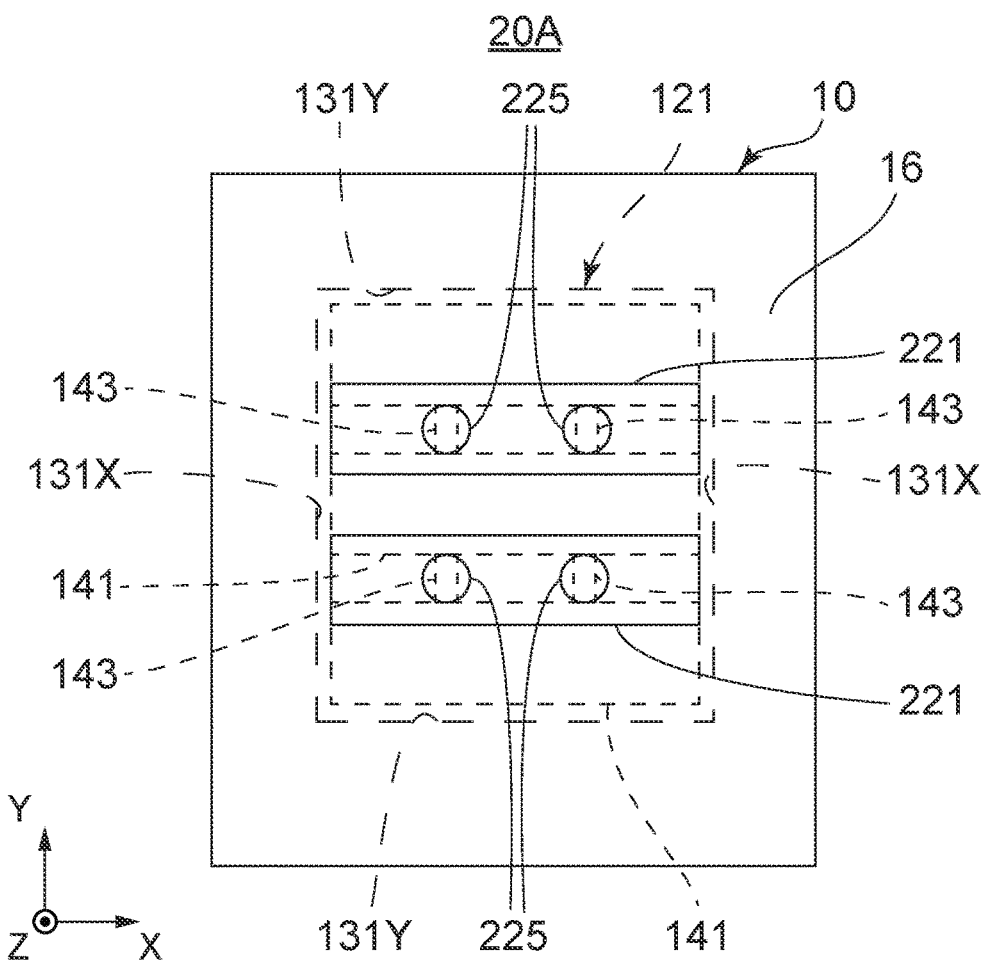
FIG. 16 is a plan view showing a circuit board after forming the conductor portion, wherein the circuit board is manufactured using a modified example of the circuit board of FIG. 1. A cavity and a magnetic member are illustrated by broken lines.

Although the specific explanation about the present invention is made above with reference to the embodiments, the present invention is not limited thereto but susceptible of various modifications and alternative forms. For example, in the aforementioned embodiment, a longitudinal direction of the upper conductor portions 221 and a longitudinal direction of the magnetic pieces 141 are perpendicular to each other. However, the longitudinal direction of the upper conductor portions 221 and the longitudinal direction of the magnetic pieces 141 may be parallel to each other as in a circuit board 20A shown in FIG. 16 to obtain desired characteristics. In that case, if the magnetic pieces 141 adjacent to each other are coupled to each other by the positioning members 143 which are made of material identical to that of the magnetic pieces 141, the positioning members 143 should be cut by forming the vias 225.

Figure 17:
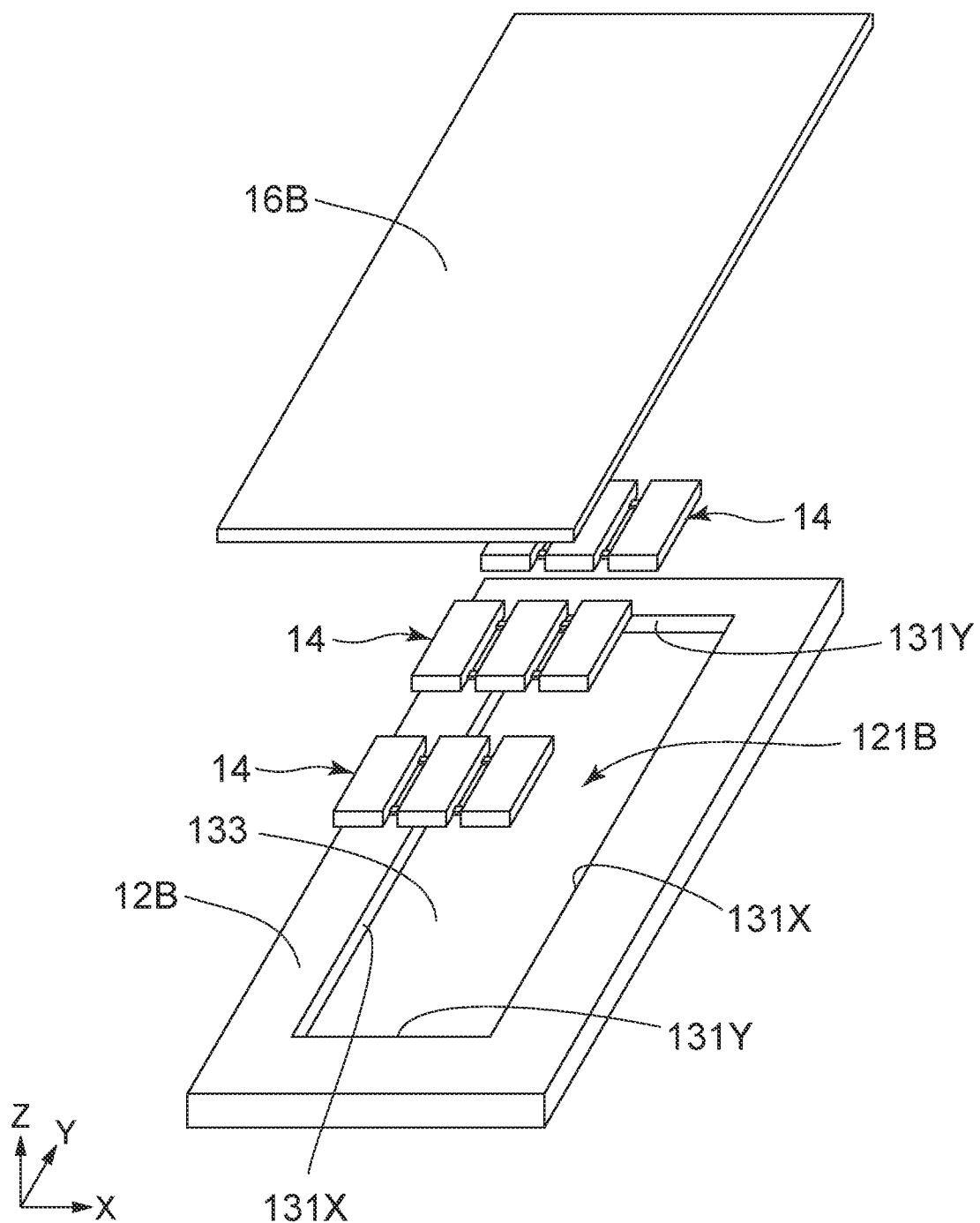
FIG. 17 is an exploded, perspective view showing a circuit board according to another embodiment of the present invention.
Figure 18:
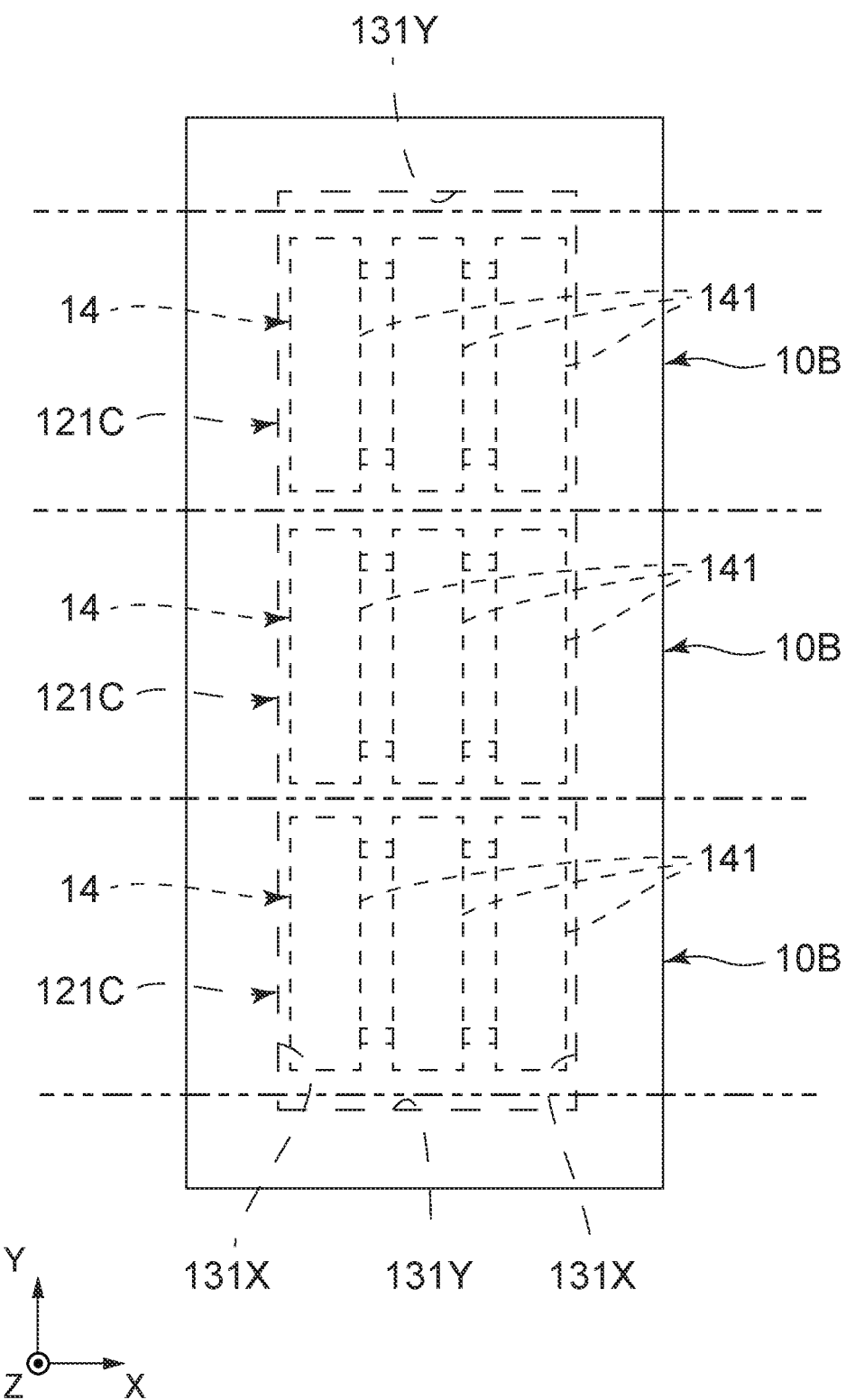
FIG. 18 is a plan view showing the circuit board of FIG. 17. A cavity and a magnetic member are illustrated by broken lines.

Moreover, although the description of the aforementioned embodiment is made about a case where one circuit board 10 is manufactured, a plurality of the circuit boards 10B (see FIG. 18) may be simultaneously manufactured. That can be realized by using a first substrate member 12B provided with a cavity 121B corresponding to a plurality of magnetic members 14 and a second substrate member 16B corresponding to the first substrate member 12B as shown in FIG. 17, for example. As shown in FIG. 18, the circuit boards 10B can be obtained by cutting the first substrate member 12B and the second substrate member 16B along chain double-dashed lines so that each of the circuit boards 10B includes one of the magnetic members 14. Incidentally, cutting of the first substrate member 12B and the second substrate member 16B may be carried out before or after forming of conductor portions 22. Moreover, a cavity 121C in each of the circuit boards 10B is defined by a pair of sidewalls 131X facing each other in the lateral direction and a bottom surface 133.

Although the magnetic members 14 are independent from one another in the example shown in FIGS. 17 and 18, they may be integrally formed. In detail, the magnetic pieces 141 adjacent to each other in the front-rear direction may be formed as a single continuous magnetic piece. In that case, on each of cut surfaces of the circuit boards 10B, cut surfaces of the magnetic pieces 141 are exposed. If necessary, a protective layer may be formed, for example by applying a resin, on the cut surface of the circuit board 10B.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. A method of manufacturing a circuit board, the method comprising:
   preparing a first substrate member in which a cavity is formed, the cavity being defined at least in part by a pair of wall surfaces facing each other in a lateral direction and opening upward in an up-down direction perpendicular to the lateral direction;

preparing a magnetic member having a plurality of magnetic pieces which are coupled with each other by using at least one positioning member so that the magnetic pieces are arranged at regular intervals in a predetermined direction;

placing the magnetic member in the cavity so that the predetermined direction coincides with the lateral direction or a front-rear direction perpendicular to both of the lateral direction and the up-down direction; and closing the cavity by placing a second substrate member on the first substrate member.

2. The method as recited in claim 1, wherein:

the at least one positioning member is integrally formed with the magnetic pieces using material identical to a material of the magnetic pieces; and the method further comprises forming at least one via which pierces the first substrate member and the second substrate member so as to pass through the cavity, and through which the at least one positioning member is removed at least in part so that the magnetic pieces are divided from each other.

3. The method as recited in claim 2, wherein:

the at least one via has a diameter size in a width direction perpendicular to the predetermined direction;

the at least one positioning member has a width size in the width direction;

the forming of the at least one via is carried out so that the diameter size is larger than the width size;

the diameter size and the width size have a first difference therebetween;

the cavity and the magnetic member have a second difference in size therebetween in a direction coinciding with the width direction; and the first difference is larger than the second difference.

4. The method as recited in claim 1, wherein the at least one positioning member is made of material different from a material of the magnetic pieces and couples respective surfaces of the magnetic pieces with each other.

5. A circuit board comprising a first substrate member, a magnetic member, and a second substrate member, wherein:

the first substrate member has a cavity corresponding to the magnetic member formed therein;

the cavity is defined at least in part by a pair of wall surfaces facing each other in a lateral direction and opens upward in an up-down direction perpendicular to the lateral direction;

the magnetic member has a plurality of magnetic pieces;

the magnetic pieces are provided in the cavity and arranged at regular intervals along the lateral direction or a front-rear direction perpendicular to both of the lateral direction and the up-down direction; and the second substrate member is provided on the first substrate member so as to close the cavity.

6. The circuit board as recited in claim 5, wherein:

each of the magnetic pieces has at least one side surface facing an adjacent one of the magnetic pieces; and the at least one side surface has a cut mark remaining thereon or is connected to a positioning member having a cut mark.

7. The circuit board as recited in claim 6, wherein:

the circuit board further comprises at least one via which pierces the first substrate member and the second substrate member; and each of the at least one via is in contact with the cut mark of each of two adjacent ones of the magnetic pieces.

8. The circuit board as recited in claim 7, wherein:

the at least one via has a diameter size in a perpendicular direction perpendicular to the direction in which the magnetic pieces are arranged;

the cut mark has a cut mark size in the perpendicular direction;

the diameter size is larger than the cut mark size by a first difference;

the cavity and the magnetic member have a second difference in size therebetween in the perpendicular direction; and the first difference is larger than the second difference.

9. The circuit board as recited in claim 5, wherein the magnetic pieces are coupled with each other by at least one positioning member which is made of a material different from a material of the magnetic pieces.

\* \* \* \* \*